(12) United States Patent
Baker et al.

(10) Patent No.: US 10,465,889 B2
(45) Date of Patent: *Nov. 5, 2019

(54) LIGHT BOARD

(71) Applicant: Hubbell Incorporated, Shelton, CT (US)

(72) Inventors: Derek B. Baker, Middleboro, MA (US); Cory A. Passerello, Plymouth, MA (US); Thomas Clawson, Boiling Springs, SC (US)

(73) Assignee: Hubbell Incorporated, Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/054,655

(22) Filed: Aug. 3, 2018

(65) Prior Publication Data

US 2018/0340680 A1 Nov. 29, 2018

Related U.S. Application Data

(63) Continuation of application No. 15/097,946, filed on Apr. 13, 2016, now Pat. No. 10,054,300.

(Continued)

(51) Int. Cl.
*F21V 23/00* (2015.01)
*F21S 8/04* (2006.01)
(Continued)

(52) U.S. Cl.
CPC .............. *F21V 23/003* (2013.01); *F21S 8/04* (2013.01); *F21V 23/009* (2013.01); *H05K 1/0286* (2013.01); *F21Y 2103/10* (2016.08); *F21Y 2115/10* (2016.08); *H05K 2201/09063* (2013.01); *H05K 2201/09127* (2013.01); *H05K 2201/10106* (2013.01)

(58) Field of Classification Search
CPC .................. H05K 2201/09127; F21Y 2115/10
See application file for complete search history.

(56) References Cited

U.S. PATENT DOCUMENTS 4,173,035 A 10/1979 Hoyt
4,335,272 A 6/1982 Pittenger
(Continued)

OTHER PUBLICATIONS

PCT/US2016/027314 International Search Report and Written Opinion dated Jul. 18, 2016 (21 pages).

*Primary Examiner* — Alexander K Garlen
(74) *Attorney, Agent, or Firm* — Michael Best & Friedrich, LLP

(57) ABSTRACT

A light board for a light fixture includes a first portion and a second portion. The first portion includes at least one light emitting element, and the second portion includes at least one light emitting element. A first state is defined by the second portion being coupled to the first portion and a second state is defined by the second portion being detached from the first portion. In the first state, the light emitting elements of the first portion and the second portion are configured to provide an evenly distributed light output along at least the combined length of the first portion and the second portion. In the second state, the at least one light emitting element of the first portion is configured to provide an evenly distributed light output along at least the length of the first portion.

18 Claims, 5 Drawing Sheets

Related U.S. Application Data

(60) Provisional application No. 62/146,653, filed on Apr. 13, 2015.

(51) Int. Cl.
   *H05K 1/02* (2006.01)
   *F21Y 103/10* (2016.01)
   *F21Y 115/10* (2016.01)

(56) References Cited

U.S. PATENT DOCUMENTS

| | | |
|---|---|---|
| 6,183,104 B1 | 2/2001 | Ferrara |
| 7,980,863 B1 | 7/2011 | Holec et al. |
| 8,007,286 B1 | 8/2011 | Holec et al. |
| 8,143,631 B2 | 3/2012 | Crandell et al. |
| 8,410,720 B2 | 4/2013 | Holec et al. |
| 8,500,456 B1 | 8/2013 | Holec et al. |
| 8,525,193 B2 | 9/2013 | Crandell et al. |
| 8,632,214 B1 | 1/2014 | Tickner |
| 8,710,764 B2 | 4/2014 | Holec et al. |
| 8,851,356 B1 | 10/2014 | Holec et al. |
| 2009/0267533 A1 | 10/2009 | Lee |
| 2009/0296381 A1 | 12/2009 | Dubord |
| 2009/0310335 A1 | 12/2009 | Park |
| 2010/0008090 A1 | 1/2010 | Li et al. |
| 2010/0073931 A1 | 3/2010 | Watanabe |
| 2010/0220479 A1 | 9/2010 | Yamashita |
| 2010/0271804 A1 | 10/2010 | Levine |
| 2010/0277098 A1 | 11/2010 | Sarna |
| 2011/0285314 A1 | 11/2011 | Carney |
| 2011/0286207 A1 | 11/2011 | Chan |
| 2012/0044689 A1 | 2/2012 | Kraus |
| 2013/0228804 A1* | 9/2013 | Yan ............... H01L 25/0753 257/88 |
| 2014/0022791 A1 | 1/2014 | Sun |
| 2014/0063803 A1 | 3/2014 | Yaphe et al. |
| 2014/0265809 A1 | 9/2014 | Hussell |

\* cited by examiner

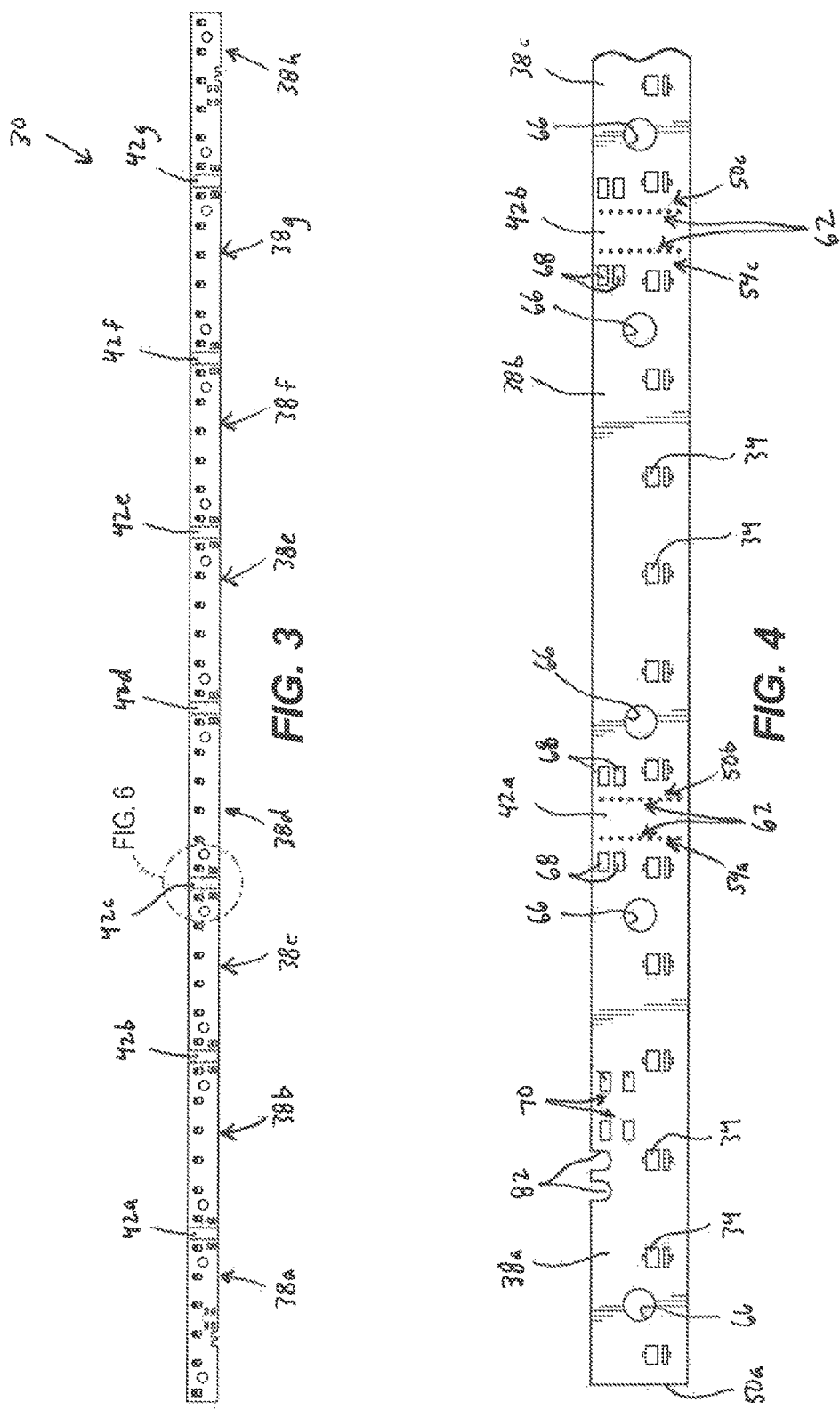

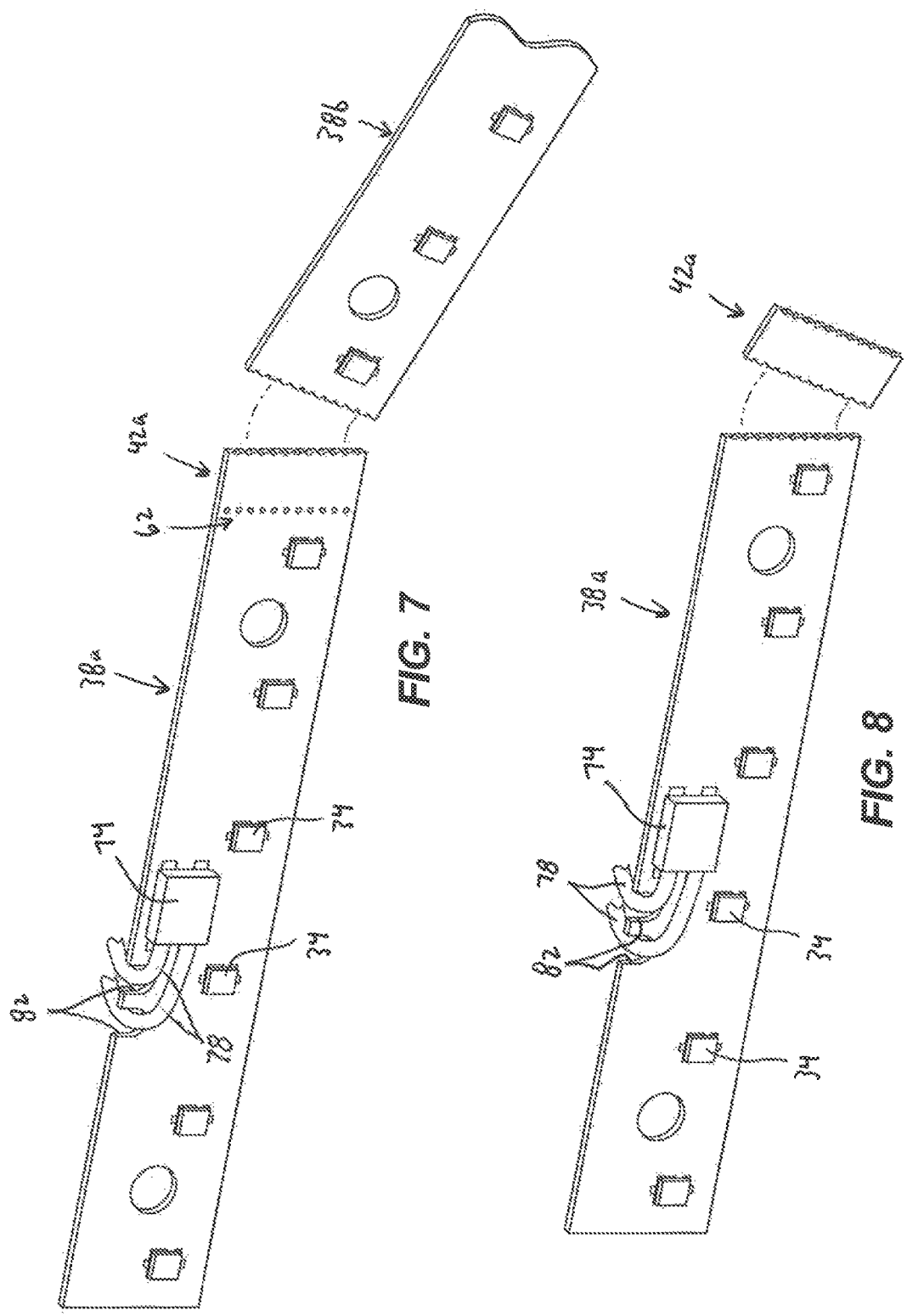

LIGHT BOARD

CROSS-REFERENCE TO RELATED APPLICATIONS

This application is a continuation of co-pending, prior-filed U.S. patent application Ser. No. 15/097,946, filed Apr. 13, 2016, which claims the benefit of U.S. Provisional Patent Application No. 62/146,653, filed Apr. 13, 2015, the entire contents of which is incorporated by reference herein.

BACKGROUND

The present application relates to light fixtures, and particularly to a light-emitting diode (LED) board for a light fixture.

Conventional light fixtures include a reflector and a board supporting a number of LEDs. The board is in electrical communication with a power source and a programmable driver for controlling the output of the LEDs.

SUMMARY

In one aspect, a light board for a light fixture includes a first portion and a second portion. The first portion includes at least one light emitting element, a first end, and a second end. The second portion includes at least one light emitting element, a first end, and a second end. The first end of the second portion is detachably coupled to the second end of the first portion. A first state is defined by the second portion being coupled to the first portion and a second state is defined by the second portion being detached from the first portion. In the first state, the at least one light emitting element of the first portion and the at least one light emitting element of the second portion are configured to provide an evenly distributed light output along at least the combined length of the first portion and the second portion. In the second state, the at least one light emitting element of the first portion is configured to provide an evenly distributed light output along at least the length of the first portion.

In another aspect, a light board includes a first portion, a connecting portion, and a second portion. The first portion includes at least one light emitting element, a first end, and a second end. The connecting portion is detachably coupled to the second end of the first portion. The second portion includes at least one light emitting element, a first end, and a second end. The first end is detachably coupled to the connecting portion. The first state is defined by the first portion, the connecting portion, and the second portion being coupled together sequentially, and a second state is defined by the connecting portion and the second portion being detached from the first portion. In the first state, each light emitting element of the first portion and each light emitting element of the second portion are configured to provide an evenly distributed light output along at least the combined length of the first portion and the second portion. In the second state, each light emitting element of the first portion is configured to provide an evenly distribute light output along at least the length of the first portion.

In yet another aspect, a light engine including a light board and a driver. The light board includes a first portion and a second portion. The first portion includes a plurality of first light emitting elements and defines a first end and a second end. The second portion includes a plurality of second light emitting elements and defines a first end and a second end. The first end of the second portion is detachably coupled to the second end of the first portion. The light board defines a first state in which the second portion is coupled to the first portion and defines a second state in which the second portion is detached from the first portion. The driver controls power supplied to the first light emitting elements and the second light emitting elements. The driver is programmed to provide a first power output across the first light emitting elements and the second light emitting elements when the light board is in the first state. The driver is programmed to provide a second power output across the first light emitting elements when the light board is in the second state.

Other aspects will become apparent by consideration of the detailed description and accompanying drawings.

BRIEF DESCRIPTION OF THE DRAWINGS

FIG. 3 is a plan view of the light board of FIG. 1.

FIG. 4 is an enlarged plan view of a portion of the light board of FIG. 3.

FIG. 7 is a perspective view of a portion of the light board with a second strip detached from a first strip.

FIG. 8 is a perspective view of a portion of the light board with a connecting portion detached from a first strip.

DETAILED DESCRIPTION

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Unless specified or limited otherwise, the terms "mounted," "connected," "supported," and "coupled" and variations thereof are used broadly and encompass both direct and indirect mountings, connections, supports, and couplings.

Figure 1:
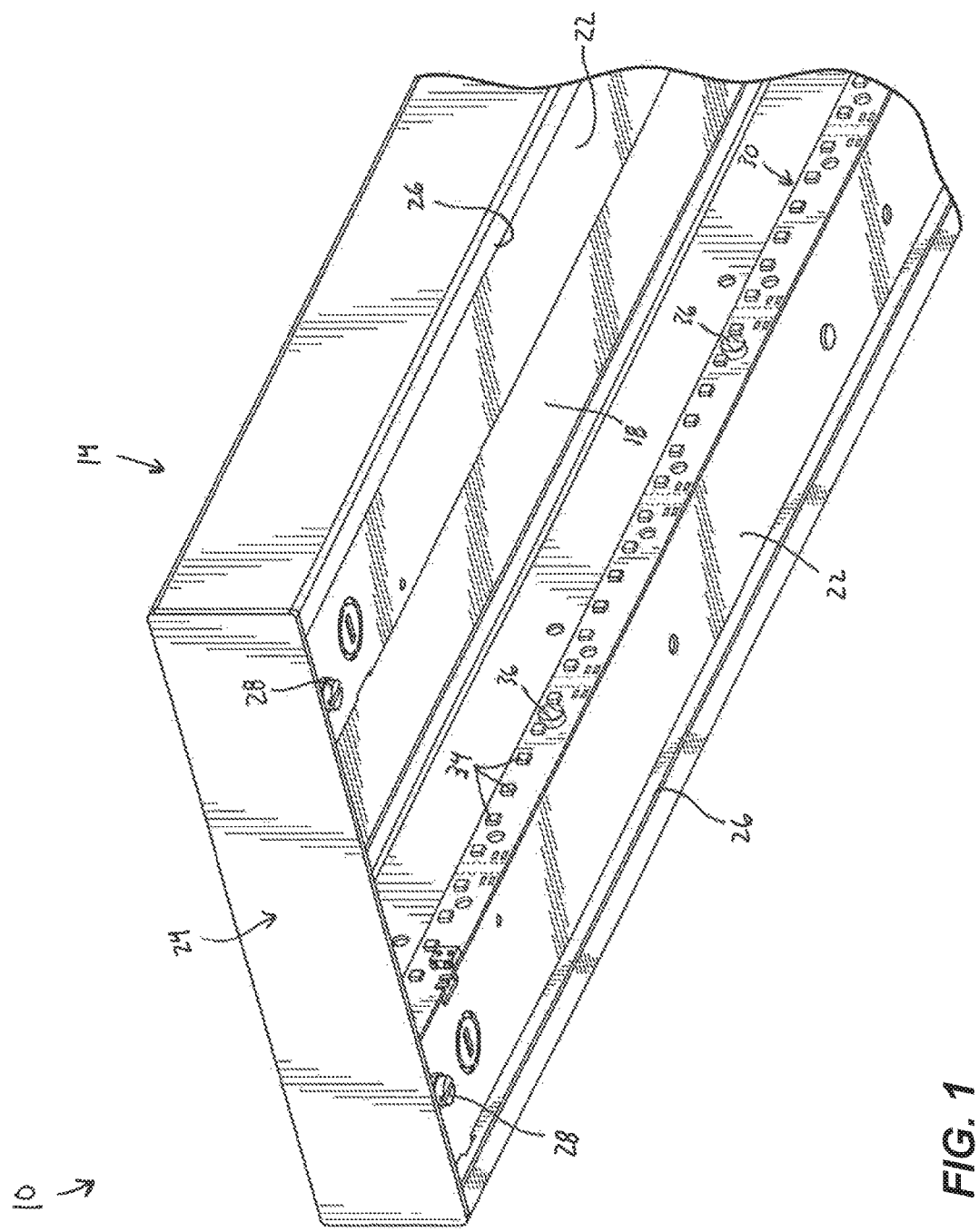
FIG. 1 is a perspective view of a portion of a light fixture including a light board.
Figure 2:
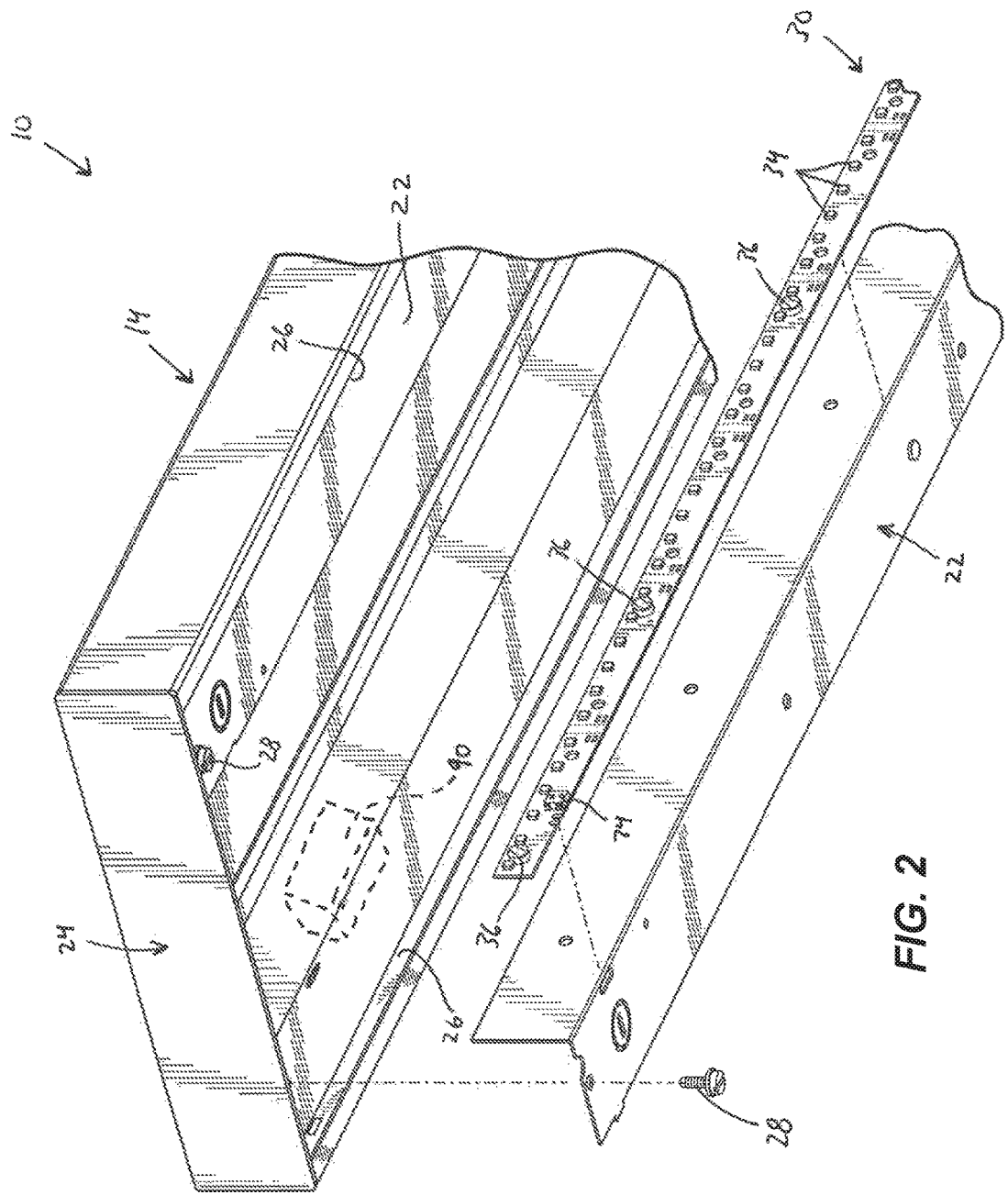
FIG. 2 is an exploded view of the light fixture of FIG. 1.

FIGS. 1 and 2 illustrate a portion of a light fixture 10. In one embodiment, the light fixture 10 is used in a commercial or industrial environment. The fixture 10 includes a housing 14, a reflector 18 positioned within the housing 14, and a bracket 22 coupled to the housing 14. In the illustrated embodiment, the housing 14 includes an end 24 and a pair of side surfaces 26. Only one end 24 is shown in FIGS. 1 and 2, but it is understood that a similar end is positioned at the other end of the housing 14. In some embodiments, the housing 14 is secured to a ceiling. It is understood that the housing 14 and the reflector 18 may have a different shape.

The bracket 22 is secured to the housing 14, e.g., by one or more first fasteners 28. The housing 14 and bracket 22 support a light engine including a light board 30 and a driver 90 (FIG. 2). The bracket 22 supports the light board 30, which includes multiple light emitting elements 34. In the illustrated embodiment, the light board 30 is secured to the bracket 22 by second fasteners 36. The fixture 10 may also include a lens (e.g., a refractor or diffuser—not shown) coupled to the housing 14, and the lens may extend between the ends 24 and at least partially between the side surfaces 26. The lens may cover the light board 30 to provide a desired light distribution for the light emitted by the light emitting elements 34. The lens may cover at least a portion of the reflector 18 and bracket 22.

As shown in FIG. 3, the light board 30 is a printed circuit board (PCB) supporting the light emitting elements 34. In the illustrated embodiment, each light emitting element 34 is a light emitting diode or LED. The light board 30 is formed as an elongated strip including multiple sections or portions or light strips 38 arranged in a linear manner. In the illustrated embodiment, each light strip 38 has a uniform length, and each light strip 38 is coupled to an adjacent light strip 38 by a connecting portion 42. That is, the light board 30 is divided sequentially into the follow sections: a first light strip 38a, a first connecting portion 42a, a second light strip 38b, a second connecting portion 42b, a third light strip 38c, etc. In the illustrated embodiment, the light board 30 includes eight light strips 38a-h and seven connecting portions 42a-f positioned between the adjacent light strips 38. In other embodiments, the light board 30 may include fewer or more light strips 38 and connecting portions 42.

As shown in FIG. 4, each light strip 38 defines a first end 50 and a second end 54 opposite the first end 50. In the illustrated embodiment, the second end 54a of a first light strip 38a is detachably coupled to the first connecting portion 42a which is in turn detachably coupled to a first end 50b of a second light strip 38b. Similarly, the second end 54b of the second light strip 38b is detachably coupled to the second connecting portion 42b which is in turn detachably coupled to a first end 50c of a third light strip 38c. The junction between each light strip 38 and each adjacent connecting portion 42 includes a perforation 62 to facilitate breaking or severing each respective light strip 38 from the adjacent connecting portion 42. In the illustrated embodiment, each perforation is 62 is formed by a series of small holes 64 (FIG. 6) extending through the light board 30. The holes 64 are aligned along a line extending perpendicular to the length of the light board 30. In other embodiments, the perforation 62 may be formed in another manner, and/or the holes 64 may be formed in a different pattern or aligned in a different direction.

Figure 5:
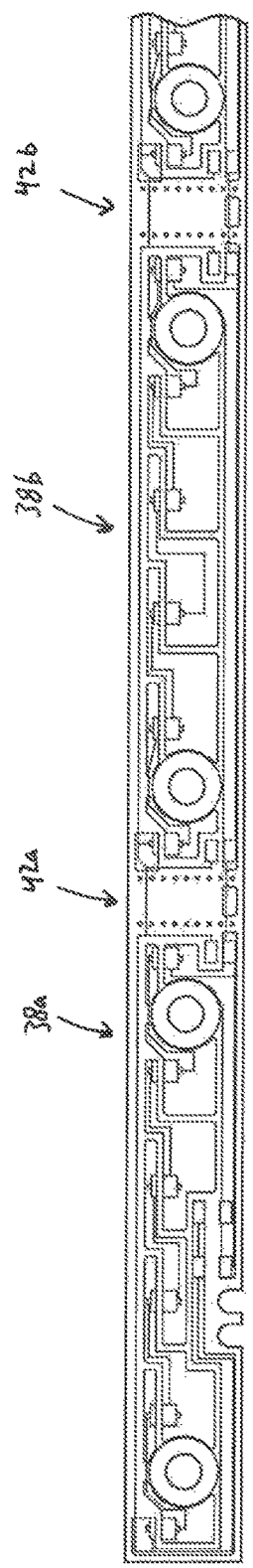
FIG. 5 is a reverse plan view of the portion of the light board of FIG. 4.

In the illustrated embodiment, each light strip 38 includes six individual light emitting elements 34 connected in series. FIG. 5 illustrates the reverse or side of the light board 30, including the circuitry for providing power to the light emitting elements 34 of each strip, according to one embodiment. The total voltage across each light strip 38 is 36 volts, and the voltage across each light emitting element 34 is 6 volts. In other embodiments, each light strip 38 may include fewer or more light emitting elements 34 and/or the voltage across each light strip 38 and each light emitting element 34 can be varied.

Figure 6:
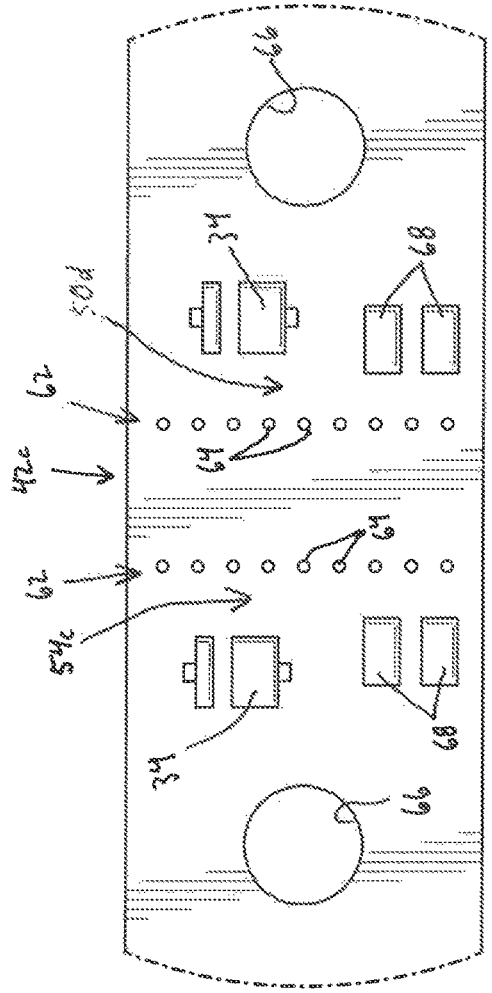
FIG. 6 is an enlarged plan view of the portion 6-6 of the light board of FIG. 3.

As shown in FIGS. 4 and 6, each light strip 38 includes a hole 66 positioned adjacent each end 50, 54 of the light strip 38. One of the second fasteners 36 (FIG. 2) can be inserted through each hole 66 to secure the light strip 38 to the bracket 22 (FIG. 2). In some embodiments, the second fastener 36 may be inserted into only some of the holes 66 along the length of the light board 30 (e.g., only the holes 66 proximate each end of the light board 30).

In the illustrated embodiment, each light strip 38 also includes electrical contact points 68 proximate each end 50, 54 of the light strip 38. The electrical contact points 68 permit an end 50, 54 of the light strip 38 (after the strip 38 has been broken from the connecting portion 42) to be electrically connected to another light strip 38, e.g., by soldering. In other embodiments, an end surface (not shown) of each light strip 38 adjacent the connecting portion 42 may include at least one contact point (not shown). When the connecting portion 42 is broken and separated from the light strip 38 at the perforation 62, the contact point is exposed and may be connected to an adjacent light strip by abutting and soldering the end surfaces of the light strips 38 such that the contact points engage one another.

As shown in FIGS. 7 and 8, the light strips 38 positioned at each end of the light board 30 include a driver terminal 70 configured to receive an electrical connector 74 in communication with a driver 90 (FIG. 2). The light board 30 further includes grooves or cutouts 82 formed along one of the edges of the light strip 38. The electrical connector 74 may include two lead wires 78, each of which is positioned within one of the cutouts 82. The lead wires 78 pass through a wireway and are connected to the driver 90. The cutouts 82 permit the edges of the light board 30 to fit flush relative to the bracket 22 and reflector 18.

As shown in FIGS. 7 and 8, during manufacture and/or assembly, an operator may modify the length of light board 30 by separating one or more strips 38 from the board 30. The number of strips 38 to be retained and separated depends on the desired length of the board 30. To adjust the length of the light board, one of the light strips 38b is broken from the connecting portion 42a (FIG. 7). In one embodiment, the connecting portion 42 is also broken and separated from the other adjacent light strip 38a (FIG. 8). That is, when the light board 30 is reduced in size to achieve a desired length, one end 50, 54 of a light strip 38 is positioned at each terminal end of the light board 30 without any connecting portion 42. In some embodiments, the light strips 38 can be broken and separated from the adjacent connecting portion(s) 42 by hand (i.e., without requiring any tools).

The severability of the light strips 38 and connecting portions 42 in small increments permits a user to modify the overall length of the light board 30 based on a length of the light fixture 10. As a result, a light board 30 having a single length can be adapted for use in a wide range of fixtures instead of requiring multiple light boards to be fabricated individually for specific fixtures. In addition, because the light board 30 can be adjusted and particularly in small increments, the light board 30 can be configured to extend along the full length (or very nearly the full length) of the fixture 10. As a result, the light board 30 can provide continuous ambient light and reduce dark zones or shadows within the fixture 10. Each light strip 38 and connecting portion 42 has a length measured in along a direction extending between the ends of the light board 30. In one embodiment, each light strip 38 has a length of approximately 2.8 inches and each connecting portion 42 has a length of 0.2 inches so that one light strip 38 and one connecting portion 42 have a combined length of 3 inches. The light board 30 can be adjusted in increments of 3 inches. As a result, a light fixture 10 can be formed in any multiple of three inches, and the light board 30 can be adjusted to accommodate the entire length (or very nearly the entire length) of the fixture 10. The connecting portions 42 have a relatively short length, and removing a connecting portion 42 provides clearance for the light board 30 to be inserted behind the reflector 18 of the fixture 10 and attached to the bracket 22.

The light strips 38 are powered by a programmable driver 90 (e.g., positioned in the housing 14—FIG. 2). The driver 90 is adjusted by an operator/installer to provide the desired voltage and power output across the length of the light board 30 based on the customized length of the light board 30. For example, when the light board 30 includes two light strips 38, the driver 90 is programmed to provide a first power output across the combined length of the two strips 38 and the respective connecting portion 42. When the light board 30 includes one light strip 38, the driver 90 is programmed to provide a second power output across the length of one light strip in order to maintain an even light distribution. The programmable driver 90 therefore ensures that the light board 30 provides a desired light output that is evenly distributed along the length of the light board 30. The modular nature of the light board 30 allows the board 30 to be adjusted in relatively small increments while still providing an efficient light output. The light board 30 includes a modular structure and is powered by a programmable driver, thereby permitting the light board 30 to have a customizable length and to provide evenly distributed light along the length of the light board 30.

Although certain embodiments have been described in detail, variations and modifications exist within the scope and spirit of one or more independent aspects as described.

What is claimed is:

1. A light board for a light fixture, the light board comprising:
   a first portion including at least one light emitting element, a first end, and a second end;
   a second portion including at least one light emitting element, a first end, and a second end, the first end coupled to the second end of the first portion; and
   a first perforation positioned between the first portion and the second portion representing a preferential line of detachment between the first portion and the second portion in response to application of a bending stress,
   a connecting portion including no light emitting elements directly coupled to the second end of the first portion and to the first end of the second portion, the first perforation being positioned between the second end of the first portion and the connecting portion, and
   a second perforation positioned between the first end of the second portion and the connecting portion representing a preferential line of detachment between the connecting portion and the second portion in response to application of a bending stress.

2. The light board of claim 1, further comprising a third portion including at least one light emitting element, the third portion defining a first end and a second end, the first end of the third portion coupled to the second end of the second portion; and
   a third perforation positioned between the second portion and the third portion representing a preferential line of detachment between the second portion and the third portion in response to application of a bending stress.

3. The light board of claim 1, wherein the combined length of the first portion and the connecting portion is no longer than three inches.

4. The light board of claim 1, wherein the second end of the first portion includes a first contact point, wherein the first end of the second portion includes a second contact point capable of being in electrical communication with the first contact point.

5. The light board of claim 1, wherein each light emitting element of the first portion is configured to be controlled by a programmable driver, wherein the driver is programmed to provide a first power output across the first portion and the second portion when the first portion is coupled to the second portion, wherein the driver is programmed to provide a second power output across the first portion when the second portion is detached from the first portion.

6. The light board of claim 1, wherein, in a first state the second portion is coupled to the first portion and, in a second state the second portion being detached from the first portion substantially along the first perforation,
   wherein, in the first state, the at least one light emitting element of the first portion and the at least one light emitting element of the second portion are configured to provide an evenly distributed light output along at least the combined length of the first portion and the second portion,
   wherein, in the second state, the at least one light emitting element of the first portion is configured to provide an evenly distributed light output along at least the length of the first portion.

7. The light board of claim 6, further comprising a third portion including at least one light emitting element, the third portion defining a first end and a second end, the first end of the third portion coupled to the second end of the second portion; and
   a third perforation positioned between the second portion and the third portion at which the third portion will detach from the second portion due to the application of a predetermined bending stress,
   wherein in a third state the third portion is detached from the second portion along the third perforation between the second portion and the third portion while the second portion remains coupled to the first portion,
   wherein, in the first state, the third portion is coupled to the first portion through the second portion, each light emitting element of the first portion, the second portion, and the third portion being configured to provide an evenly distributed light output along at least the combined length of the first portion, the second portion, and the third portion,
   wherein, in the third state, each light emitting element of the first portion and each light emitting element of the second portion being configured to provide an evenly distributed light output along at least the combined length of the first portion and the second portion.

8. A light board comprising:
   a first portion including at least one light emitting element, a first end, and a second end;
   a connecting portion coupled to the second end of the first portion, the connecting portion supporting no light emitting elements;
   a first junction positioned between the first portion and the connecting portion;
   a second portion including at least one light emitting element, a first end, and a second end, the first end coupled to the connecting portion, and
   a second junction positioned between the second portion and the connecting portion,
   wherein the first junction includes a plurality of first openings defining a preferential line of detachment between the first portion and the connecting portion in response to application of a bending stress, and
   wherein the second junction includes a plurality of second openings defining a preferential line of detachment between the connecting portion and the second portion in response to application of a bending stress.

9. The light board of claim 8, further comprising a second connecting portion supporting no light emitting elements and coupled to the second end of the second portion, and a third junction positioned between the second portion and the second connecting portion; and
   a third portion including at least one light emitting element, the third portion defining a first end and a second end, the first end of the third portion coupled to the second connecting portion; and
   a fourth junction positioned between the second connecting portion and the third portion.

10. The light board of claim 8, wherein the combined length of the first portion and the connecting portion is no longer than three inches.

11. The light board of claim 8, wherein the second end of the first portion includes a first contact point, wherein the first end of the second portion includes a second contact point is capable of being in electrical communication with the first contact point.

12. The light board of claim 8, wherein each light emitting element of the first portion is configured to be controlled by a programmable driver, wherein the driver is programmed to provide a first power output across the first portion and the second portion when the first portion is coupled to the second portion, wherein the driver is programmed to provide a second power output across the first portion when the second portion is detached from the first portion.

13. The light board of claim 8, wherein a first state is defined by the first portion, the connecting portion, and the second portion being coupled together sequentially, and a second state is defined by the connecting portion and the second portion being detached from the first portion,
   wherein, in the first state, the at least one light emitting element of the first portion and the at least one light emitting element of the second portion are configured to provide an evenly distributed light output along at least the combined length of the first portion and the second portion,
   wherein, in the second state, each light emitting element of the first portion is configured to provide an evenly distribute light output along at least the length of the first portion.

14. The light board of claim 8, wherein the first junction is a first perforation and the second junction is a second perforation.

15. A light engine comprising:
   a light board including a first portion and a second portion, the first portion including a plurality of first light emitting elements, a first end, and a second end, the second portion including a plurality of second light emitting elements, a first end, and a second end, the first end of the second portion being coupled to the second end of the first portion about a first junction and a second junction positioned between the first portion and a second portion, the first junction and the second junction each including a perforation representing a preferential line of detachment between the first portion and the second portion in response to application of a bending stress, the second portion being coupled to the first portion in a first state and the second portion being detached from the first portion in a second state;
   a connecting portion including no light emitting elements and positioned between the second end of the first portion and the first end of the second portion, the connecting portion coupled to the second end of the first portion by the first junction and the first end of the second portion by the second junction; and
   a driver for controlling power supplied to the first light emitting elements and the second light emitting elements, the driver being programmed to provide a first power output across the first light emitting elements and the second light emitting elements when the light board is in the first state, the driver programmed to provide a second power output across the first light emitting elements when the light board is in the second state.

16. The light engine of claim 15, further comprising a third portion including a plurality of third light emitting elements, the third portion defining a first end and a second end, the first end of the third portion coupled to the second end of the second portion about a third junction representing a preferential line of detachment between the second portion and the third portion in response to application of a bending stress,
   wherein in a third state the third portion is separated from the second portion along the third junction while the second portion remains coupled to the first portion,
   wherein, in the first state, the third portion is coupled to the first portion through the second portion, and the first light emitting elements, the second light emitting elements, and the third light emitting elements are configured to provide an evenly distributed light output along at least the combined length of the first portion, the second portion, and the third portion,
   wherein, in the third state, the first light emitting elements and the second light emitting elements are configured to provide an evenly distributed light output along at least the combined length of the first portion and the second portion.

17. The light engine of claim 15, wherein the combined length of the first portion and the connecting portion is no longer than three inches.

18. The light engine of claim 15, wherein the second end of the first portion includes a first contact point, wherein the first end of the second portion includes a second contact point in electrical communication with the first contact point when the light board is in the first state.

* * * * *